United States Patent
de Souza et al.

(10) Patent No.: US 7,550,369 B2
(45) Date of Patent: Jun. 23, 2009

(54) METHOD FOR FABRICATING LOW-DEFECT-DENSITY CHANGED ORIENTATION SI

(75) Inventors: Joel Pereira de Souza, Putnam Valley, NY (US); Keith Edward Fogel, Hopewell Junction, NY (US); John Albrecht Ott, Greenwood Lake, NY (US); Devendra Kumar Sadana, Pleasantville, NY (US); Katherine Lynn Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/873,928

(22) Filed: Oct. 17, 2007

(65) Prior Publication Data
US 2008/0057684 A1      Mar. 6, 2008

Related U.S. Application Data

(63) Continuation of application No. 11/031,142, filed on Jan. 7, 2005, now Pat. No. 7,285,473.

(51) Int. Cl.
*H01L 21/20*      (2006.01)
(52) U.S. Cl. .................. 438/486; 438/455; 438/514; 438/766; 257/E21.564; 257/E21.567
(58) Field of Classification Search .............. 438/12, 438/89, 293, 407, 480, 489; 257/E21.147, 257/E21.191, E21.247, E21.48
See application file for complete search history.

(56) References Cited

U.S. PATENT DOCUMENTS 6,759,303 B1    7/2004  Cartagena (Continued)

OTHER PUBLICATIONS

Yang, et al., "High Performance CMOS Fabricated on Hybrid Substrate with Different Crystal Orientations," IEDM 2003, Paper 18.7.
Seidel, "Rapid Thermal Processing (RTP) of Shallow Silicon Junctions,"Mat. Res. Soc. Symp. Proc., 1985, pp. 7-20, vol. 45.

(Continued)

*Primary Examiner*—Walter L Lindsay, Jr.
*Assistant Examiner*—Cheung Lee
(74) *Attorney, Agent, or Firm*—Scully, Scott, Murphy & Presser, P.C.; Louis Percello, Esq

(57) ABSTRACT

The present invention provides a method for forming low-defect density changed-orientation Si by amorphization/templated recrystallization (ATR) processes in which regions of Si having a first crystal orientation are amorphized by ion implantation and then recrystallized into the orientation of a template layer having a different orientation. More generally, the invention relates to the high temperature annealing conditions needed to eliminate the defects remaining in Si-containing single crystal semiconductor materials formed by ion-implant-induced amorphization and templated recrystallization from a layer whose orientation may be the same or different from the amorphous layer's original orientation. The key component of the inventive method is a thermal treatment for minutes to hours in the temperature range 1250-1330° C. to remove the defects remaining after the initial recrystallization anneal. The invention also provides a low-defect density changed-orientation Si formed by ATR for use in hybrid orientation substrates.

16 Claims, 5 Drawing Sheets

U.S. PATENT DOCUMENTS

| | | | |
|---|---|---|---|
| 6,793,731 B2 * | 9/2004 | Hsu et al. | 117/3 |
| 2002/0093039 A1 * | 7/2002 | Coolbaugh et al. | 257/213 |
| 2004/0195646 A1 | 10/2004 | Yeo et al. | |
| 2004/0256700 A1 | 12/2004 | Doris et al. | |
| 2005/0116290 A1 | 6/2005 | De Souza et al. | |
| 2006/0154442 A1 | 7/2006 | De Souza et al. | |

OTHER PUBLICATIONS

Hasenack, et al., "The Suppression of Residual Defects of Silicon Implanted with Group III, IV and V Elements," Semicond. Sci. Technol., 1987, pp. 477-484, vol. 2.

* cited by examiner

METHOD FOR FABRICATING LOW-DEFECT-DENSITY CHANGED ORIENTATION SI

RELATED APPLICATION

This application is a continuation of U.S. patent application Ser. No. 11/031,142, filed Jan. 7, 2005. This application is related to cofiled U.S. application Ser. No. 11/031,165 filed on Jan. 7, 2005, "Quasi-hydrophobic Si—Si wafer bonding using hydrophilic Si surfaces and dissolution of interfacial bonding oxide" which is incorporated herein by reference.

FIELD OF THE INVENTION

The present invention relates to the formation of low-defect density changed-orientation Si by amorphization/templated recrystallization (ATR) processes in which regions of Si having a first crystal orientation are amorphized by ion implantation and then recrystallized into the orientation of a template layer having a different orientation. More generally, the invention relates to the high temperature annealing conditions needed to eliminate the defects remaining in Si-containing single crystal semiconductor materials formed by ion-implant-induced amorphization and templated recrystallization from a layer whose orientation may be the same or different from the amorphous layer's original orientation. The invention also relates to low-defect density changed-orientation Si formed by ATR, and to hybrid orientation substrates containing this material.

BACKGROUND OF THE INVENTION

Semiconductor device technology is increasingly relying on specialty Si-based substrates to improve the performance of complementary metal oxide semiconductor (CMOS) devices, such as nFETs (i.e., n-channel MOSFETs) or pFETs (i.e., p-channel MOSFETs). For example, the strong dependence of carrier mobility on silicon orientation has led to increased interest in hybrid orientation Si substrates in which nFETs are formed in (100)-oriented Si (the orientation in which electron mobility is higher) and pFETs are formed in (110)-oriented Si (the orientation in which hole mobility is higher), as described, for example, by M. Yang, et al. "High Performance CMOS Fabricated on Hybrid Substrate with Different Crystal Orientations," IEDM 2003 Paper 18.7 and U.S. patent application Ser. No. 10/250,241, filed Jun. 17, 2003 entitled "High-performance CMOS SOI devices on hybrid crystal-oriented substrates".

Amorphization/templated recrystallization (ATR) methods for fabricating hybrid orientation substrates (see, for example, U.S. patent application Ser. No. 10/725,850, filed Dec. 2, 2003 entitled "Planar substrate with selected semiconductor crystal orientations formed by localized amorphization and recrystallization of stacked template layers") typically start with a first semiconductor layer having a first orientation bonded to a second semiconductor layer having a second orientation different from the first. Selected areas of the first semiconductor layer are amorphized by ion implantation, and then recrystallized into the orientation of the second semiconductor layer using the second semiconductor layer as a crystal template.

FIG. 1 shows an ATR method for producing a hybrid orientation Si substrate, which utilizes top amorphization and bottom templating (i.e., the first semiconductor layer being amorphized is on the top and the second semiconductor layer acting as a template is on the bottom). FIG. 1A shows starting substrate 10 comprising bottom silicon substrate layer 20 having a bottom crystal orientation, top silicon substrate layer 30 having a different crystal orientation, and bonded interface 40 between them. Selected regions of top Si substrate layer 30 are then subjected to amorphizing ion implantation 50 to produce one or more amorphized regions 60 and non-amorphized top substrate regions 30', as shown in FIG. 1B. Amorphized regions 60 span the entire thickness of the upper Si layer, and extend into lower Si layer 20. Amorphized regions 60 are then recrystallized into the bottom crystal orientation, using lower Si layer 20 as a template, to produce planar hybrid orientation substrate 70 with recrystallized, changed-orientation Si regions 80.

Traces of the damage produced by the amorphizing implant typically remain after recrystallization. For the FIG. 1 case of Si with top amorphization and bottom templating, the amorphizing implant will typically produce an "end-of-range" damage layer of highly defective crystalline Si in the template layer. This crystalline damage layer is bounded on the top by fully amorphized Si, and bounded on the bottom by the undamaged template. The damage layer interferes with the clean recrystallization of the amorphized Si, both by introducing threading defects (which can propagate to the wafer's surface) and by leaving a band of dislocation loops at the approximate position of the original damage layer. This is shown schematically in FIG. 2 for a non-patterned ATR process.

FIG. 2A shows a starting substrate structure 100, analogous to starting substrate structure 10 of FIG. 1A. FIG. 2A shows characteristic end-of-range damage layer 110 between bottom Si substrate layer 20 and amorphized layer 120 resulting from amorphizing ion implant 130. FIG. 2C shows the structure of FIG. 2B after amorphized layer 120 has recrystallized into crystalline layer 140 having the orientation of bottom silicon substrate layer 20. A layer of dislocation loops 150 has replaced damage layer 110. Threading defects 160 typically extend from some of the dislocation loops in layer 150 to the sample surface.

There is a vast literature on the subject of ion-implant induced defects and how to reduce and/or remove them, in large part because ion-implanted junctions are so critical to semiconductor device technology. For example, T. E. Seidel, in "Rapid Thermal Processing (RTP) of Shallow Silicon Junctions," Mat. Res. Soc. Symp. Proc. 45 7 (1985), has discussed defect removal as a function of temperature for temperatures up to 1200° C. for Si samples implanted with 100 keV As at a dose of 5e15/cm2. In another reference, C. M. Hasenack et al., in "The suppression of residual defects of silicon implanted with group III, IV and V elements," Semicond. Sci. Technol. 2 477 (1987), describe data suggesting that diffusion of the implanted dopants through the damage layer plays a helpful role in defect repair.

It is claimed in the prior art (e.g. T. E. Seidel, above) that end-of-range defects can be removed from I/I-amorphized 100-oriented Si by furnace or RTA annealing at temperatures <1200° C. However, this work is for cases in which diffusing dopants are present to assist in defect removal. In addition, because the focus of the prior work was on dopant activation rather than defect removal, the maximum annealing temperatures and times were constrained by the need to minimize dopant diffusion. Implant annealing at temperatures above 1200° C. has previously been taught only for the very short times (e.g., <1 sec) of laser annealing. However these short times are not optimal for defect removal in the absence of dopants (e.g., when amorphization is effected by implantation of Si+ or Ge+).

In view of the above, it would be highly desirable to have a method for repairing ion-implant-induced damage in ATR'd Si in cases for which (i) there are no implanted dopants to assist with the defect removal (e.g., the amorphization is effected with implantation of ions such as Si+ or Ge+), and (ii) the defect removal anneals are part of a process to change the Si crystal orientation. In addition it would be desirable to have a method that can work for Si orientations such as 110 (or 111), which (relative to Si 100) typically have both a higher starting defect density, and defects that are more stable and harder to remove.

More generally, it would also be desirable to have a method for amorphizing and recrystallizing selected semiconductor regions (into their original orientation or a different orientation) without introducing a large density of defects.

SUMMARY OF THE INVENTION

An object of the present invention is to provide an annealing process optimized for the removal of implant-damage-induced defects in single crystal silicon.

A related object of the present invention is to provide an ATR method for changing the orientation of selected regions of silicon without leaving a large density of defects.

Another object of the present invention to provide ATR'd Si and/or ATR'd Si-containing semiconductors that have a negligible density of defects.

It is an additional object of the present invention to provide hybrid orientation substrates containing regions of low-defect-density Si and/or Si-containing semiconductors whose orientation was changed by ATR.

The objects of the present invention are achieved with a new recrystallization process for ion-implant-amorphized Si that produces a recrystallized Si material that is virtually free of dislocation loops and has a low density of threads. The recrystallization process can be viewed as consisting of two basic components:
  a. an initial recrystallization anneal, and
  b. a defect removal anneal.

The initial recrystallization anneal would typically be performed with any of a variety of prior art recrystallization conditions, typically at a temperature between about 500° C. and about 700° C., and produce a single crystal material containing a high density of defects. The annealing temperature is preferably high enough to produce a reasonable rate of recrystallization, yet low enough ensure that the recrystallization is templated (rather than spontaneous and random).

The defect removal anneal is the key step of the present recrystallization process. This invention teaches a time/temperature annealing regime for removing defects in ATR'd Si different from those taught previously: the present invention teaches an anneal (in a conventional furnace or rapid thermal anneal tool, for example) for a time of at least 5 to 10 seconds in a temperature range between about 1200° C. and about 1400° C., with a time of at least 1 to 2 hours in the temperature range between about 1250 and about 1350° C. being preferred. This contrasts with the prior art, which teaches conventional annealing at temperatures below 1200° C., or laser annealing at temperatures above 1200° C. for much shorter times (e.g., less than 1 second).

DETAILED DESCRIPTION OF THE INVENTION

Figure 1A:
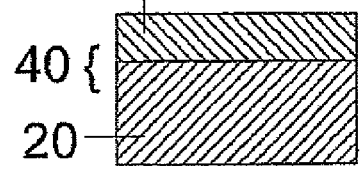
FIGS. 1A-1C are pictorial representations (through cross sectional views) illustrating a top amorphization/bottom templating ATR process for producing a hybrid orientation Si substrate.

The present invention will now be described in more detail by referring to the drawings that accompany the present application. In the accompanying drawings, like and corresponding elements are referred to by like reference numerals. It is also noted that the drawings of the present invention representing the structures during the various processing steps of the present invention are provided for illustrative purposes and are thus not drawn to scale.

Figure 3A:
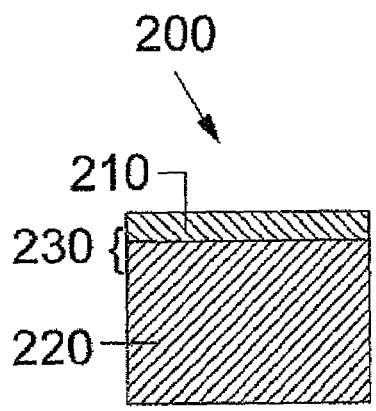
FIGS. 3A-3F are pictorial representations (through cross sectional views) illustrating the steps of an embodiment of the present inventive process for achieving low-defect-density changed orientation Si.
Figure 3B:
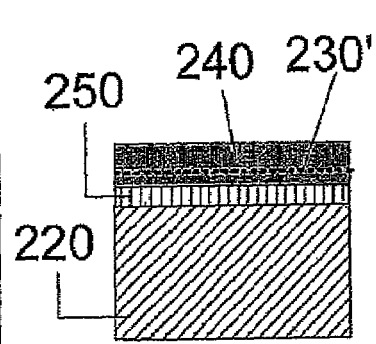
Figure 3C:
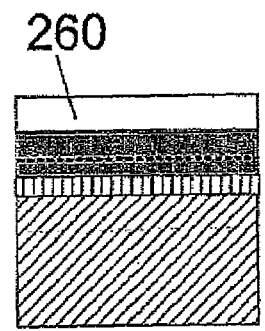
Figure 3D:
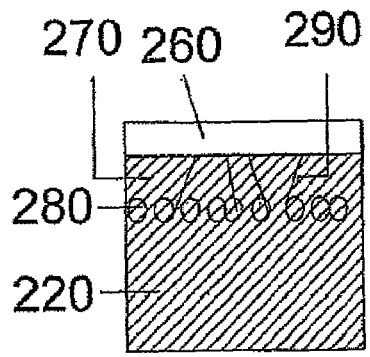
Figure 3E:
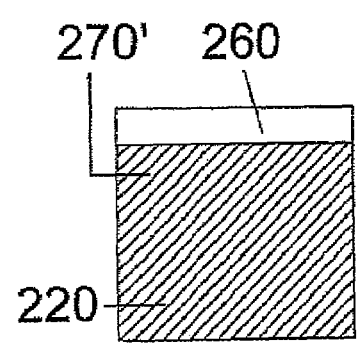
Figure 3F:
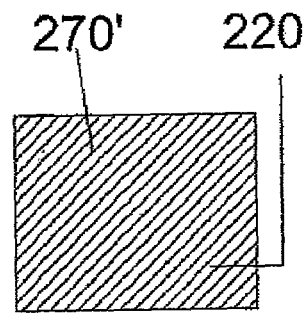

Reference is first made to FIGS. 3A-3F which are pictorial representations (through cross sectional views) illustrating the steps of an embodiment of the present inventive process for achieving low-defect-density changed orientation Si for the case of top amorphization and bottom templating. FIG. 3A shows starting substrate 200 which includes a first silicon layer 210 having a first orientation bonded to a second silicon layer 220 having a second orientation different from the first, first and second silicon layers separated by bonded interface 230. FIG. 3B shows the structure of FIG. 3A after the first silicon layer has been amorphized by ion implantation to create amorphous layer 240 extending past the location of the original bonded interface, indicated by dotted line 240', and damaged crystalline layer 250 having the orientation of lower silicon layer 220. FIG. 3C shows the structure of FIG. 3B after deposition of optional protective cap layer 260, and FIG. 3D shows the structure of FIG. 3C after an initial recrystallization anneal to produce changed-orientation silicon layer 270 having the orientation of underlying Si layer 220. Changed-orientation layer 270 contains dislocation loops 280 and threading defects 290. The structure of FIG. 3D is then subjected to a defect-removal anneal to produce the structure of FIG. 3E with low-defect-density changed-orientation silicon layer 270'. FIG. 3F shows the structure of FIG. 3E after removal of protective cap layer 260 and/or any additional layers (e.g., surface or interfacial oxides) produced during the defect removal anneal. The term low-defect-density as used herein means less than 10E6 defects per cm2 to provide material suitable for semiconductor devices to be formed therein.

Figure 4A:
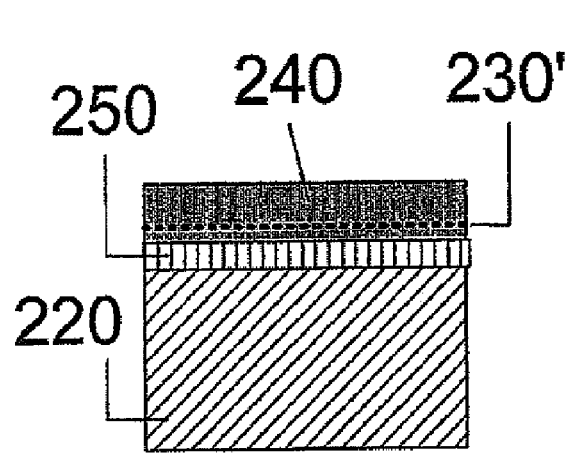
FIGS. 4A-4C are pictorial representations (through cross sectional views) illustrating a minor variation in the order of the steps of FIGS. 3B-3D.
Figure 4B:
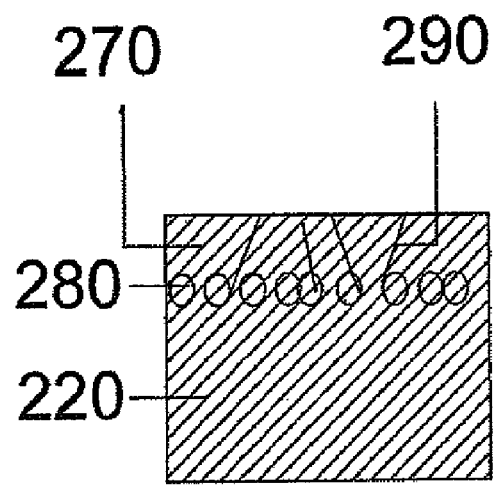
Figure 4C:
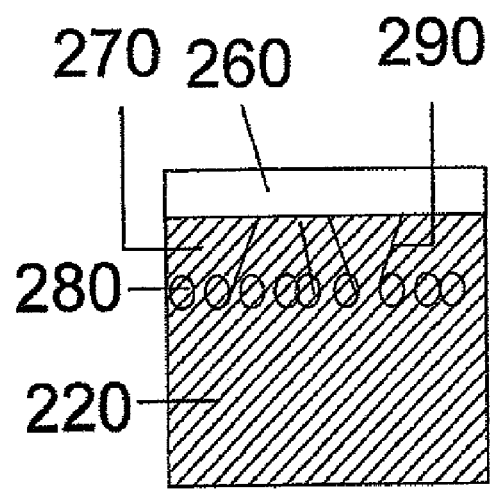

While FIGS. 3B-3D show the step of depositing the optional protective cap layer occurring before the initial recrystallization anneal, the optional protective cap layer may also be deposited after the initial recrystallization anneal, as illustrated in FIGS. 4A-4C. The approach of FIG. 4 is recommended for cases in which the cap layer deposition occurs at a temperature high enough to recrystallize amorphized layer

240. However, if desired, the initial recrystallization anneal and cap layer deposition steps may be combined and performed simultaneously (if the cap layer deposition temperature is high enough).

Figure 1B:
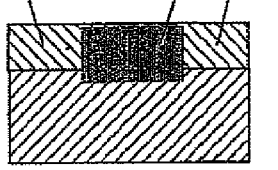
Figure 1C:
Figure 2A:
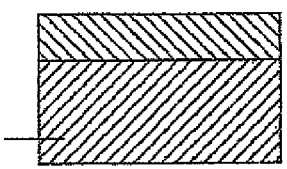
FIGS. 2A-2C are pictorial representations (through cross sectional views) illustrating the types and locations of defects remaining after the ATR process of FIG. 1.
Figure 2B:
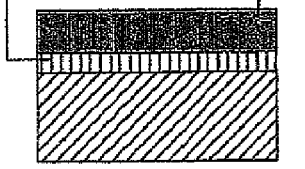
Figure 2C:
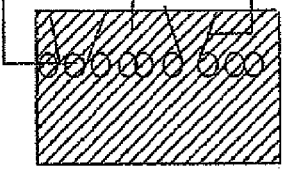

It should be noted that the amorphization shown in FIG. 3B may be performed in selected areas only, as was the case with the structure of FIG. 1B. Likewise, it should be noted that the structures of FIGS. 3 and 4 may include embedded dielectric regions such as shallow trench isolation regions or other features (not shown). These embedded regions may be present in starting substrate 200 before the amorphization step shown in FIG. 3B, or they may be added at a later stage in the processing.

The recrystallization process of FIG. 3 may be viewed as consisting of two basic components:
an initial recrystallization anneal, and
a defect removal anneal.

The initial recrystallization anneal would typically be performed with any of a variety of prior art recrystallization conditions, typically at a temperature between about 500° C. and about 700° C., and produce a single crystal material containing a high density of defects. The annealing temperature is preferably high enough to produce a reasonable rate of recrystallization, yet low enough to ensure that the recrystallization is templated (rather than spontaneous and random).

The defect removal anneal is the key step of the present recrystallization process. This invention teaches a time/temperature annealing regime for removing defects in ATR'd Si different from those taught previously: the present invention teaches an anneal (in a furnace or rapid thermal anneal tool, for example) for a time of at least 5 to 10 seconds in a temperature range between about 1200° C. and about 1400° C., with a time of at least 1 to 2 hours in the temperature range between about 1250 and about 1350° C. being preferred.

The defect removal anneal may be performed in at least one ambient selected from the group including vacuum, He, Ne, Ar, Kr, Xe, nitrogen and nitrogen-containing gases, oxygen and oxygen-containing gases, halogens and halogen-containing gases, carbon-containing gases, hydrogen and hydrogen-containing gases, and mixtures thereof. As discussed in U.S. application Ser. No. 11/031,165 filed on Jan. 7, 2005, entitled "Quasi-hydrophobic Si—Si wafer bonding using hydrophilic Si surfaces and dissolution of interfacial bonding oxide," the annealing ambient is preferably inert or mildly oxidizing (e.g., $Ar/O_2$ with 0.1-2% $O_2$), so as to prevent pitting due to SiO formation and volatilization.

Furnace anneals at 1320° C. in Ar(1.2% $O_2$) have been shown to produce Si material that appears virtually defect-free when examined by TEM and/or SEM. Examples, several of which will be discussed below, include near-complete defect removal from Si-ion-implant-amorphized Si layers approximately 750 nm in thickness for the cases of (i) oxide capping/100-oriented Si templates (after anneals comprising ramps to and/or holds at temperatures in the range 1300-1320° C.), (ii) oxide capping/110-oriented Si templates (after an anneal of 1320° C./3 hrs); and near-complete defect removal from Ge-ion-implant-amorphized Si layers approximately 280 nm in thickness for the case of no capping/100-oriented Si templates (after an anneal of 1320° C./3 hrs).

The exact annealing method (furnace annealing, rapid thermal annealing, laser annealing, etc.) and annealing parameters (time-at-temperature, temperature, ramp rate, etc.) are preferably selected to minimize the thermal budget, process cost and/or process time to get the desired reduction in defect level density while still maintaining the desired crystallinity of the semiconductor material being processed. The required time and temperature of annealing needed is expected to depend on the type semiconductor material, its orientation, and the type and density of the defects. When the ambient is oxidizing, the amount of Si surface oxidation can be reduced by coating the samples with a disposable protective cap layer (e.g., $SiO_2$) prior to the defect removal anneal. As discussed above, the protective cap layer may be deposited before, during, or after the initial crystallization anneal.

The optional protective cap layer (shown as 260 in FIGS. 3 and 4) would typically comprise one or more layers of deposited materials that are thermally stable, non-reactive with respect to the underlying semiconductor regions, and easy to selectively remove after the defect removal anneal. Preferred materials for a deposited protective cap layer include one or more layers selected from the group of materials including $SiO_2$, $SiN_x$, or SiOxNy, Si (amorphous, polycrystalline or single crystalline). Protective cap layer thicknesses are preferably in the range from 30 to 500 nm. It should be noted that the cap layer is optional, and may be omitted (especially if some Si consumption is tolerable).

Preferred cap layer structures include single layers of $SiO_2$; bilayers comprising a lower layer of $SiO_2$ with upper layers of SiN or poly-Si; and trilayers comprising a lower layer of $SiO_2$, middle layer of poly-Si, and upper layer of $SiO_2$. The advantages and disadvantages of these various cap layer structures, along with some exemplary layer thicknesses, are discussed in cofiled U.S. patent application Ser. No. 11/031, 165. In general, thick (50-200 nm) single layer $SiO_2$ caps are preferred for substrate surfaces comprising only Si. However, these thick oxide caps are not recommended for substrates already containing embedded oxide regions (e.g., shallow trench isolation), due to the expected difficulties in removing the cap oxide without removing too much of the embedded oxide.

A main aspect of the present invention pertains to providing an ATR method for changing the orientation of selected regions of silicon without leaving a large density of defects. A method for forming low-defect-density changed-orientation silicon would thus comprise the steps of selecting a substrate which includes a first silicon layer having a first orientation bonded to a second silicon layer having a second orientation different from the first;

amorphizing selected areas of the first silicon layer by ion implantation; and recrystallizing the amorphized first silicon layer into the orientation of the second silicon layer using the second silicon layer as a crystal template, said recrystallization performed with a recrystallization process such as the "initial crystallization plus defect removal anneal process" described above that produces a recrystallized material with a low defect density.

It should be noted that said first and second silicon layers may include one or more dopants or impurities at a concentration below 2 atomic percent, that the selected-area amorphization may be by implantation of Si and/or Ge ions, and that the recrystallized Si material with a low defect density may have one of the following orientations: 100, 110, or 110. It should further be noted that while the first silicon layer being amorphized is shown as being on top of the second silicon layer (i.e., the case of top amorphization and bottom templating), the invention also encompasses the case of a geometry in which the second silicon layer is above the first silicon layer (i.e., for the case of top templating and bottom amorphization). In this case, the first silicon layer is preferably disposed on a buried oxide layer, and amorphized with ion implantation conditions that produce a buried amorphous layer. Uses for this alternative ATR geometry are described in U.S. patent application Ser. No. 10/725,850.

The same steps may also be used to form a low-defect-density changed-orientation Si-containing semiconductor by replacing at least one of the first and second silicon layers above with a Si-containing semiconductor. The first and second Si-containing semiconductors may be the same or different, and may be selected from the group including Si, SiGe, Ge, SiC, any of these materials doped with C or other elements. The temperature for defect removal anneal may need to be adjusted downward for substrates with lower melting temperatures such as SiGe and Ge. Additionally, the first and second Si-containing semiconductor orientations may be the same or different. When the orientations are the same, the amorphized semiconductor is merely recrystallized without an orientation change.

A final embodiment of this invention provides hybrid orientation substrates including low-defect-density changed-orientation single crystal Si (or Si-containing semiconductors) formed by the methods of this invention.

The following example is provided to illustrate the present invention and to demonstrate the efficacy of the same.

EXAMPLES

The steps of an exemplary anneal for the Si recrystallization process of this invention are listed below.
Ramp up from 250° C. to 650° C. at 5° C./min in Ar+ 650° C./30 min in Ar+
Ramp up from 650° C. to 1000° C. at 5° C./min in Ar+
Ramp up from 1000° C. to 1150° C. at 2° C./min in $Ar/O_2$ (0.63%)+
Ramp up from 1150° C. to 1310° C. at 1° C./min in $Ar/O_2$ (0.63%)+
Ramp up from 1310° C. to 1320° C. at 0.5° C./min in $Ar/O_2$(1.2%)+ 1320° C./3 h in $Ar/O_2$(1.2%)+
Ramp down from 1320° C. to 1150° C. at −2° C./min in $Ar/O_2$(0.63%)+
Ramp down to 400° C. at −5° C./min in $N_2$.

The 650° C./30 min Ar anneal may be viewed as the initial recrystallization anneal, while the 1320° C./3 hr anneal in $Ar/O_2$ may be viewed as the defect removal anneal. Without a protective cap layer, this anneal would typically produce 90-110 nm of $SiO_2$, corresponding to the consumption of about 50 nm of Si. With a protective cap layer of 100 nm $SiO_2$, additional oxide formation is reduced to about 30 nm, corresponding to the consumption of about 15 nm of Si. As mentioned above, the initial recrystallization and defect removal components of the anneal could also be performed separately.

Figure 5A:
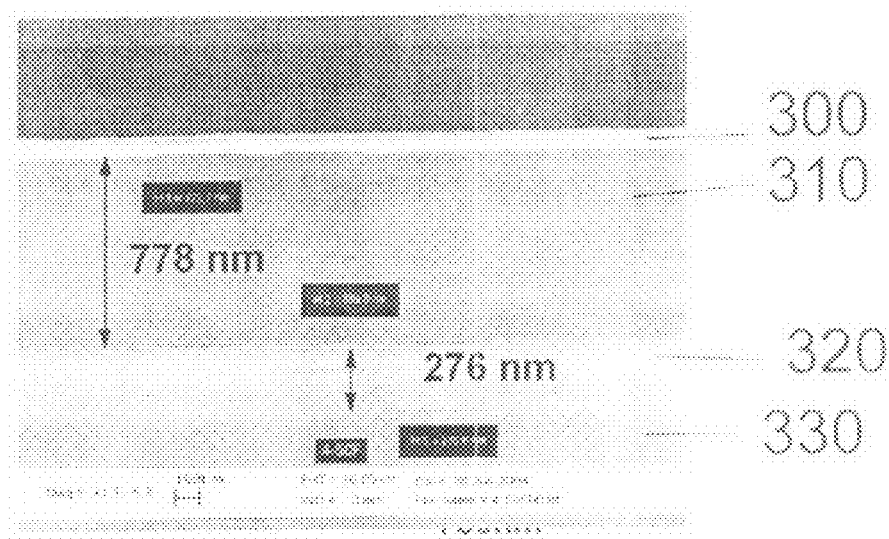
FIGS. 5A-5C show cross-section-view scanning electron micrographs (SEMs) of 100-oriented Si as-implanted (A), after an initial recrystallization anneal at 650° C. for 5 minutes (B), and after a defect removal anneal taught by the present invention (C)
Figure 5B:
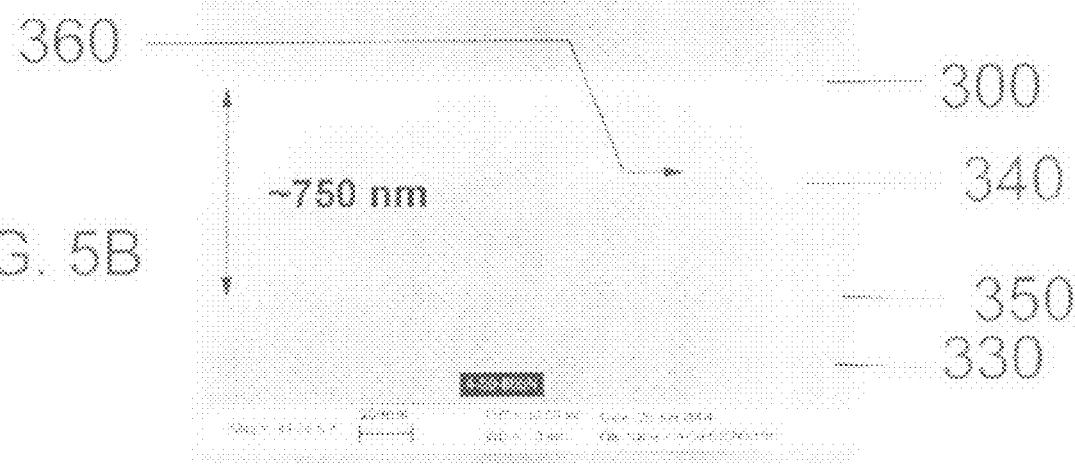
Figure 5C:
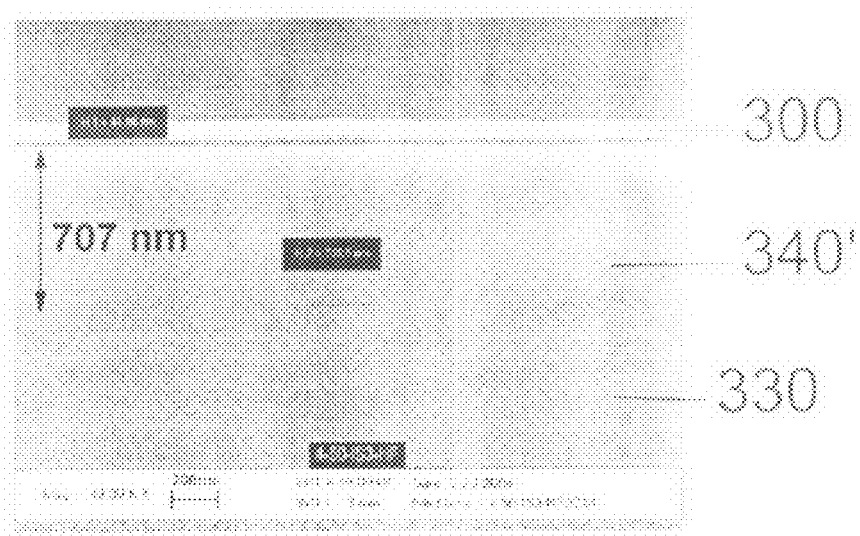

FIGS. 5A-5C show cross-section SEM images of p−-type 100-oriented Si samples at various stages of annealing after implantation with 1e15/cm2 50 keV Si+ and 4e15/cm2 220 keV Si++ (the latter implant being equivalent to 4e15/cm2 of 440 keV Si++). The samples were coated with Cr and then Secco etched after cleaving to delineate any defects. FIG. 5A shows an SEM image of the as-implanted sample with Cr layer 300, with amorphous layer 310, end-of-range crystalline damage layer 320, and undamaged crystalline substrate layer 330. The amorphous layer is about 780 nm thick, and the damage layer is about 280 nm thick. FIG. 5B shows the sample of FIG. 5A after an initial recrystallization anneal in N2 at 650° C. for 5 min to produce recrystallized 100-oriented Si layer 340. A layer of dislocation loops 350 is visible at the end-of-range damage position, and a threading defect is faintly visible at the position indicated by arrow 360. FIG. 5C shows the sample of FIG. 5A after the exemplary 650° C./30 min+1320° C./3 hr anneal described above, followed by a dip in dilute aqueous HF to remove the ~900 nm of oxide formed during the anneal. The dislocation loops are gone from their original position (which would now be ~707 nm below the surface, after accounting for the Si consumption during the defect-removal anneal), and the recrystallized Si 340' appears defect-free.

Figure 6:
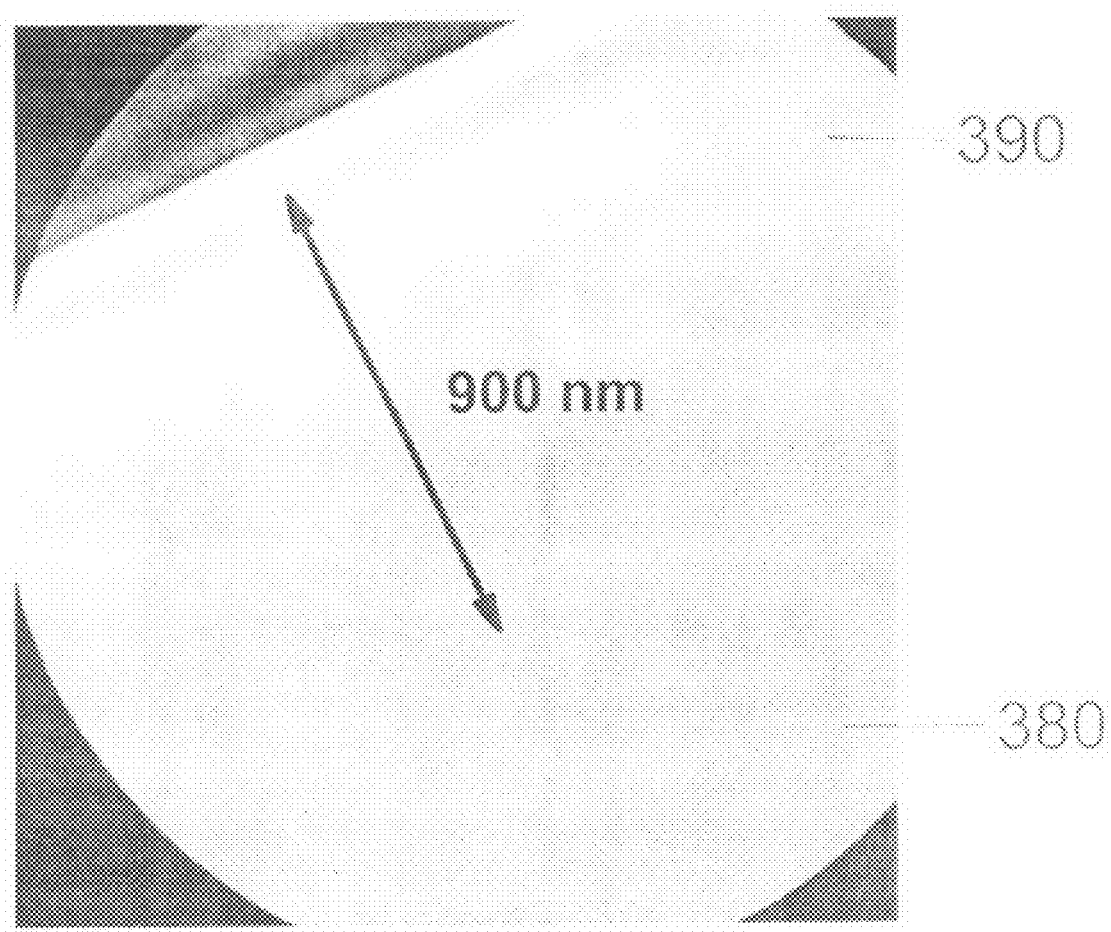
FIG. 6 shows a cross-section-view transmission electron micrograph (TEM) of ion-implant-amorphized 100-oriented Si after a recrystallization process which included a defect removal anneal taught by the present invention.

FIG. 6 shows a cross section TEM image of a 100-oriented Si sample given the same amorphization implant, but coated with a 200-nm-thick protective cap layer of low-temperature (400° C.) oxide prior to the same exemplary 650° C./30 min+1320° C./3 hr recrystallization anneal described above, and then etched in dilute aqueous HF to remove the oxide. The sample appears to be defect-free, with no difference between the never-damaged Si 380 and the Si region 390 amorphized and recrystallized according to the methods of the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for forming low-defect-density changed-orientation silicon comprising the steps of selecting a substrate which includes a first silicon layer having a first orientation bonded to a second silicon layer having a second orientation different from the first;
amorphizing selected areas of the first silicon layer by ion implantation; and
recrystallizing the amorphized first silicon layer into the orientation of the second silicon layer using the second silicon layer as a crystal template, said recrystallization performed with an initial recrystallization anneal at a temperature ranging from 500° C. to 700° C. to provide a recrystallized silicon layer having a defect density greater than 10E6 defects per $cm^2$ and a defect removal anneal for a time period of at least 10 seconds at a temperature ranging from 1250° C. to 1350° C. following the initial recrystallization anneal that produces a recrystallized silicon material with a low defect density.

2. The method of claim 1 wherein the selected area amorphization is effected by implantation of Si and/or Ge ions.

3. The method of claim 1 wherein the defect removal anneal is conducted for a time of at least 10 seconds in the temperature range of about 1200° C. to about 1400° C.

4. The method of claim 3 performed in at least one ambient selected from the group including vacuum, He, Ne, Ar, Kr, Xe, nitrogen and nitrogen-containing gases, oxygen and oxygen-containing gases, halogens and halogen-containing gases, carbon-containing gases, hydrogen and hydrogen-containing gases, and mixtures thereof 5. The method of claim 3 performed in an ambient comprising Ar with 0.01 to 2% $O_2$.

6. The method of claim 1 wherein the defect removal anneal is conducted for a time of at least 2 hours in the temperature range of about 1250° to about 1350° C.

7. The method of claim 1 wherein at least one of said first and second silicon layers include dopants or impurities at a concentration below 2 atomic percent.

8. The method of claim 1 wherein said recrystallized Si material with a low defect density has one of the following orientations: 100, 110, 111.

9. The method of claim 1 wherein said substrate includes embedded regions of insulator for at least some part of said recrystallization process.

10. The method of claim 1 wherein prior to the recrystallization a disposable cap is deposited and after said defect removal anneal said disposable cap is removed.

11. A method for forming a low-defect-density changed-orientation Si-containing semiconductor comprising the steps of
    selecting a substrate which includes a first Si-containing semiconductor layer having a first orientation bonded to a second Si-containing semiconductor layer having a second orientation different from the first;
    amorphizing selected areas of the first semiconductor layer by ion implantation; and
    recrystallizing the amorphized first semiconductor layer into the orientation of the second semiconductor layer using the second semiconductor layer as a crystal template, said recrystallization performed with an initial recrystallization anneal at a temperature ranging from 500° C. to 700° C. to provide a recrystallized silicon layer having a defect density greater than 10E6 defects per cm$^2$ and a defect removal anneal for a time period of at least 10 seconds at a temperature ranging from 1250° C. to 1350° C. following the initial recrystallization anneal that produces a recrystallized silicon material with a low defect density.

12. The method of claim 11 wherein the first and second Si-containing semiconductor layers are the same or different, and are selected from the group including Si, SiGe, Ge, SiC, any of these materials doped with C or other elements.

13. The method of claim 11 wherein prior to the recrystallization a disposable cap is deposited and after said defect removal anneal said disposable cap is removed.

14. A low-defect density changed-orientation single crystal Si material formed by selecting a substrate which includes a first silicon layer having a first orientation bonded to a second silicon layer having a second orientation different from the first;
    amorphizing selected areas of the first silicon layer by ion implantation; and
    recrystallizing the amorphized first silicon layer into the orientation of the second silicon layer using the second silicon layer as a crystal template, said recrystallization performed with an initial recrystallization anneal at a temperature ranging from 500° C. to 700° C. to provide a recrystallized silicon layer having a defect density greater than 10E6 defects per cm$^2$ and a defect removal anneal for a time period of at least 10 seconds at a temperature ranging from 1250° C. to 1350° C. following the initial recrystallization anneal that produces a recrystallized silicon material with a low defect density.

15. A hybrid orientation substrate containing regions of the low-defect density changed-orientation single crystal Si material of claim 14.

16. The method of claim 14 wherein prior to the recrystallization a disposable cap is deposited and after said defect removal anneal said disposable cap is removed.

* * * * *